(12) United States Patent
Ochiai et al.

(10) Patent No.: US 9,131,609 B2
(45) Date of Patent: Sep. 8, 2015

(54) WATERPROOF STRUCTURE FOR ELECTRONIC DEVICE

(75) Inventors: Kazuyuki Ochiai, Wako (JP); Yoshiaki Hirakata, Wako (JP); Akira Shirai, Tokyo (JP); Masao Okada, Tokyo (JP); Masahiko Yamaguchi, Tokyo (JP)

(73) Assignee: HONDA MOTOR CO., LTD., Tokyo (JP)

( * ) Notice: Subject to any disclaimer, the term of this patent is extended or adjusted under 35 U.S.C. 154(b) by 39 days.

(21) Appl. No.: 14/124,341

(22) PCT Filed: Jun. 23, 2011

(86) PCT No.: PCT/JP2011/064401
§ 371 (c)(1),
(2), (4) Date: Feb. 28, 2014

(87) PCT Pub. No.: WO2012/176303
PCT Pub. Date: Dec. 27, 2012

(65) Prior Publication Data
US 2014/0197656 A1    Jul. 17, 2014

(51) Int. Cl.
*H05K 5/06* (2006.01)
*B62K 19/30* (2006.01)
*B62J 9/00* (2006.01)
*B60R 16/02* (2006.01)
*B60R 16/023* (2006.01)
*H02G 3/08* (2006.01)
*H01R 13/52* (2006.01)

(52) U.S. Cl.
CPC ............ *H05K 5/069* (2013.01); *B60R 16/0222* (2013.01); *B60R 16/0239* (2013.01); *B62J 9/00* (2013.01); *B62K 19/30* (2013.01); *H02G 3/088* (2013.01); *H01R 13/5202* (2013.01); *H01R 13/5213* (2013.01)

(58) Field of Classification Search
CPC .. B60R 16/0239; B60R 25/00; B60R 25/245; B60R 25/33; B60R 2325/306; B60R 16/0222; H05K 5/069; B62K 19/30; B62J 9/00; H02G 3/088; H01R 13/5202; H01R 13/5213
USPC .............. 296/37.1, 37.15; 340/427; 180/219; 224/413, 427; 361/679.01
See application file for complete search history.

(56) References Cited

U.S. PATENT DOCUMENTS

2011/0155495 A1*   6/2011   Matsuda et al. ............... 180/219
2014/0144720 A1*   5/2014   Konno et al. .................. 180/287

FOREIGN PATENT DOCUMENTS

| JP | 09-095276   | 4/1997  |
|----|-------------|---------|
| JP | 2003-101982 | 4/2003  |
| JP | 2005-267568 | 9/2005  |
| JP | 3901566     | 1/2007  |
| JP | 2007-323158 | 12/2007 |

* cited by examiner

Primary Examiner — Joseph D Pape
(74) Attorney, Agent, or Firm — Rankin, Hill & Clark LLP

(57) ABSTRACT

A waterproof structure for an electronic device (60) includes: a case (130) which is disposed in a location in a vehicle (10) distant from a receiving antenna (61), which houses a processing unit (69) that processes location information, and which has a wiring hole (171) through which a wire (62) passes; a cylindrical part (172) which extends in the axial direction of the wire from the case in such a manner as to surround the wiring hole; a seal member (167) which is housed in a compressed state in the cylindrical part, and surrounds the wire; and a cap (160) which is attached to the case in an attachable/detachable manner, has a hole (168) through which the wire passes, and prevents the seal member from moving.

9 Claims, 13 Drawing Sheets

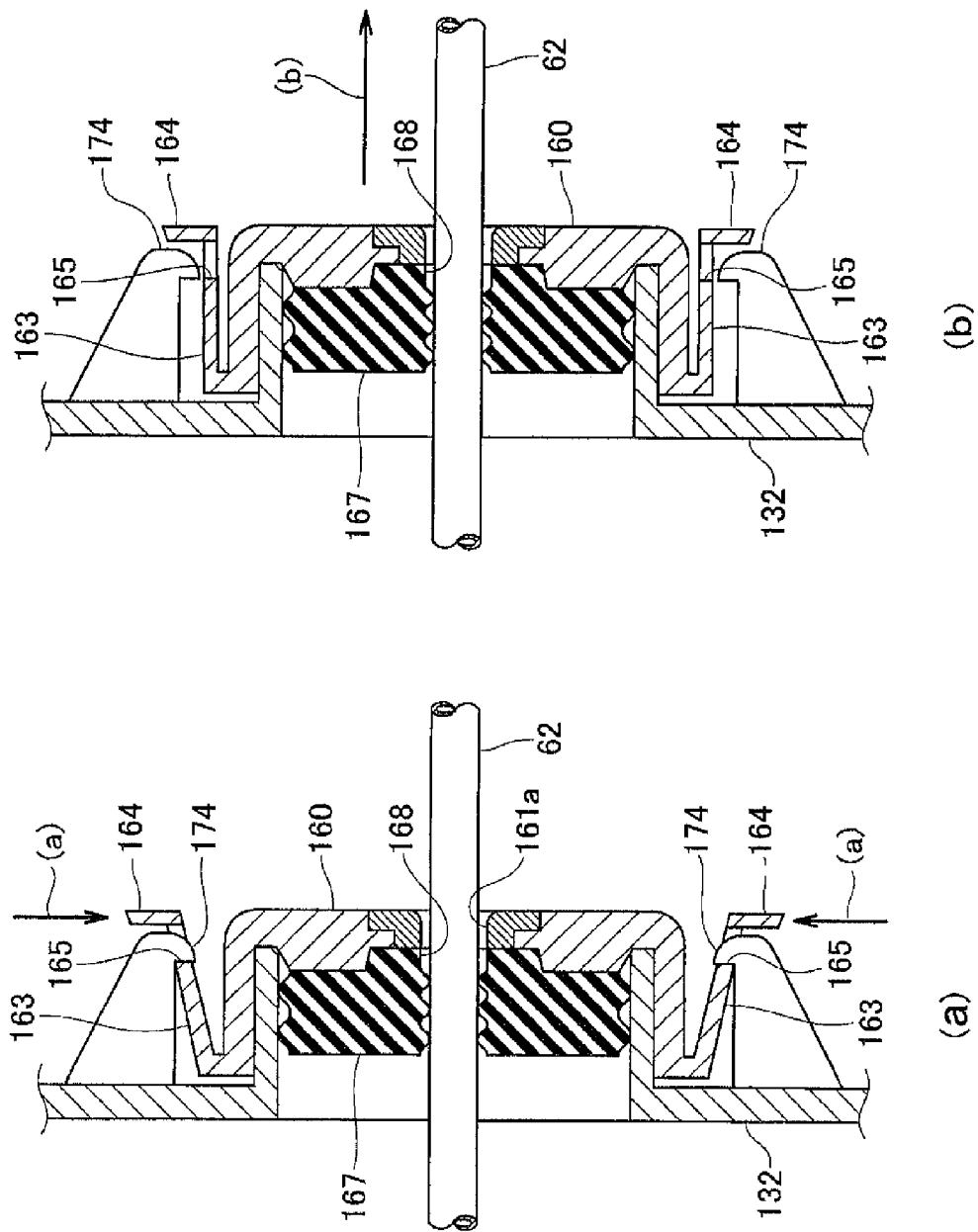

WATERPROOF STRUCTURE FOR ELECTRONIC DEVICE

TECHNICAL FIELD

The present invention relates to a waterproof structure for electronic devices and more particularly to an antitheft security system having a GPS antenna and an antitheft device connected together by a harness

BACKGROUND ART

A vehicular antitheft device is disclosed in Patent Document 1, which is installed in a vehicle and configured to detect an abnormality of the vehicle caused by a theft action when the vehicle is subjected to theft and notify the detection to the outside.

Currently known antitheft systems generally include an incorporated antenna type in which a GPS (Global Positioning System) antenna is incorporated in an antitheft device, and a separated antenna type in which the GPS antenna is separated from the antitheft device. Parts disposed inside the antitheft device require high waterproofing performance due to the necessity of the protection against moisture and the like. The incorporated antenna type antitheft system is easy to improve the waterproof performance merely by covering the entire internal parts with a case.

On the other hand, in the separated antenna type antitheft system, the GPS antenna and the antitheft device are connected by the harness. A joint portion between the harness and the antitheft device unavoidably passes through the case and, hence, high waterproofing performance is required at a part of the joint portion passing through the case. To deal with this requirement, a grommet is provided on the case so that the harness passes through the grommet.

The grommet is a substantially cylindrical elastic member and used such that an outer peripheral surface of the cylindrical member is fitted with a through-hole of the case and an inner peripheral surface is fitted with the harness. When the harness is subjected to an external force tending to deflect the harness in a direction perpendicular to an axis of the harness, the grommet deforms in a radial direction to thereby allow displacement of the harness. However, when an amount of displacement of the harness exceeds a predetermined value, a gap is formed between the inner peripheral surface of the grommet and an outer peripheral surface of the grommet, allowing water to get into the case from the gap.

This means that the grommet merely provided to accommodate the passage of the harness will unavoidably cause reduction of the waterproofing performance due to a gap produced between the harness and the grommet when the harness is displaced. It is, therefore, desirable for the antitheft system of the type having a GPS antenna separated from an antitheft device to have enhanced waterproofing performance at a part of the case through which a wire extends.

PRIOR ART LITERATURE

Patent Documents

[Patent Document 1] Japanese Patent No. 3901566

SUMMARY OF INVENTION

Technical Problem

An object of the present invention is to provide an antitheft device of the type having a separated receiving antenna, which is capable of improving waterproofing performance at a part of a case through which a wire extends.

Solution to Problem

According to the present invention, there is provided a waterproof structure for an electronic device that acquires location information, which has been acquired by a receiving antenna provide on a vehicle, from the receiving antenna via a wire, the water proof structure comprising: a case disposed in a location in the vehicle distant from the receiving antenna, housing a processing unit that processes the location information, and having a wiring hole through which the wire passes; a cylindrical part extending in an axial direction of the wire from the case in such a manner as to surround the wiring hole; a seal member housed in a compressed state in the cylindrical part and surrounding the wire; and a cap detachably mounted to the case, having a hole for the passage therethrough of the wire, covering the seal member, and fitted with the cylindrical part.

Preferably, the case includes a case body accommodating therein the processing unit, and a lid detachably mounted to the case body and having the wiring hole.

Preferably, the cap includes a cap body for closing an end face of the cylindrical part, an outer cylindrical portion extending from an edge of the cap body toward the case in such a manner as to surround the cylindrical part, and a locking portion elastically deformable toward the wire and bent back from a distal end of the outer cylindrical portion and extending in such a manner as to separate from the case past an exterior side of the outer cylindrical portion, and a hook part formed integrally with a distal end of the locking portion for engagement with a tool or fingers when the locking portion is to be deflected toward the wire, wherein the case has a locking prong for anchoring the locking portion.

Preferably, the locking portion has a locking hole for allowing passage therethrough of the locking prong.

Preferably, the cap is in engagement with the seal member to regulate movement of the seal member in a removing direction.

Preferably, the processing unit is disposed below a seat, and the receiving antenna is disposed in a front part of the vehicle.

Preferably, the processing unit is disposed in a region below a tandem seat, and the receiving antenna is disposed below a fuel tank provided behind a head pipe.

Preferably, the processing unit is disposed in a position overlapped, in a rear view of the vehicle, with a rear grip extending leftwards and rightwards from the seat in a vehicle width direction.

Preferably, the electronic device is a vehicular antitheft device for preventing theft of the vehicle based on the location information.

Advantageous Effects of Invention

In the invention as defined in claim 1, the waterproof structure for an electronic device includes a seal member housed in a compressed state in a cylindrical part of a case and surrounding a wire, and a cap detachably mounted to the case, having a hole for the passage therethrough of the wire, covering the seal member, and fitted with the cylindrical part.

Since the cap covers the seal member with the wire passing through the hole of the cap, a movement of the wire in a direction perpendicular to an axis of the wire is prevented by the case even when the wire is subjected to an external force acting in a direction perpendicular to the axis of the wire. By thus preventing the movement of the wire in the direction perpendicular to the axis of the wire, a deformation of the seal member in a radial direction thereof does not take place and no gap is created between an inner circumference of the seal member and an outer circumference of the wire. The wire is surrounded in a compressed state by the seal member and, hence, the seal member can reliably provide a seal between the wire and the seal member. Thus, the waterproofing performance of the case at a portion where the wire passes therethrough is improved.

In the invention as defined in claim 2, the case includes a case body accommodating therein the processing unit, and a lid detachably mounted to the case body and having the wiring hole.

With the lid having the wiring hole, removing the lid from the case body will allow a tool or fingers to access a joint portion provided for the wire inside the case body, making it possible to perform connection of the wire to the joint portion with ease.

In the invention as defined in claim 3, the cap includes a locking portion elastically deformable toward the wire and bent back from the distal end of an outer cylindrical portion in such a manner as to separate from the case past an exterior side of the cylindrical portion, and a hook part formed integrally with a distal end of the locking portion for engagement with a tool or fingers, and the case has a locking prong for anchoring the locking portion.

When the hook part is depressed, the locking portion undergoes elastic deformation to thereby release the interlocking engagement between the locking portion and the locking prong, allowing the cap to be removed.

In the invention as defined in claim 4, the locking portion has a locking hole for allowing passage therethrough of the locking prong.

With the locking prong engaged with the locking hole, the locking portion is reliably locked in position.

In the invention as defined in claim 5, the cap is in engagement with the seal member to regulate movement of the seal member in a removing direction. With this engagement between the cap and the seal member, the seal member is firmly secured in position against removal.

In the invention as defined in claim 6, the processing unit is disposed below the seat, and the receiving antenna is disposed in a front part of the vehicle. With the processing unit disposed below the seat, effective use of the space is possible. Furthermore, the receiving antenna disposed in the front part of the vehicle does not constitute an obstruction to the vehicle driver.

In the invention as defined in claim 7, the processing unit is disposed in a region below a tandem seat, and the receiving antenna is disposed below a fuel tank provided behind a head pipe. With the receiving antenna disposed below the fuel tank provided behind the head pipe, the receiving antenna is not subjected to a load from the vehicle driver but protected by the fuel tank. Furthermore, by thus providing the receiving antenna disposed at a higher position behind the head pipe, it is possible to improve the receiving performance of the receiving antenna.

In the invention as defined in claim 8, the processing unit is disposed in a position overlapped, in a rear view of the vehicle, with a rear grip extending leftwards and rightwards from the seat in a vehicle width direction. With this arrangement, because the processing unit is located inwardly of the rear grip in the vehicle width direction, the processing unit is protected on its lateral sides and rendered uneasy to access.

In the invention as defined in claim 9, the electronic device is a vehicular antitheft device for preventing theft of the vehicle based on location information. The vehicle such as motorcycle becomes wet while running in the rain. The electronic-device waterproof structure according to the invention completely prevents entrance of raindrops into the case and, hence, is particularly suitable for a waterproof structure for such a vehicular antitheft device.

BRIEF DESCRIPTION OF DRAWINGS

FIGS. 13(a) and 13(b) are views showing an operation of the cap.

DESCRIPTION OF EMBODIMENT

A preferred embodiment of the present invention will be described below with reference to the accompanying sheets of drawings.

Embodiment

The following is a description of the embodiment of the present invention with reference to the drawings.

Figure 1:
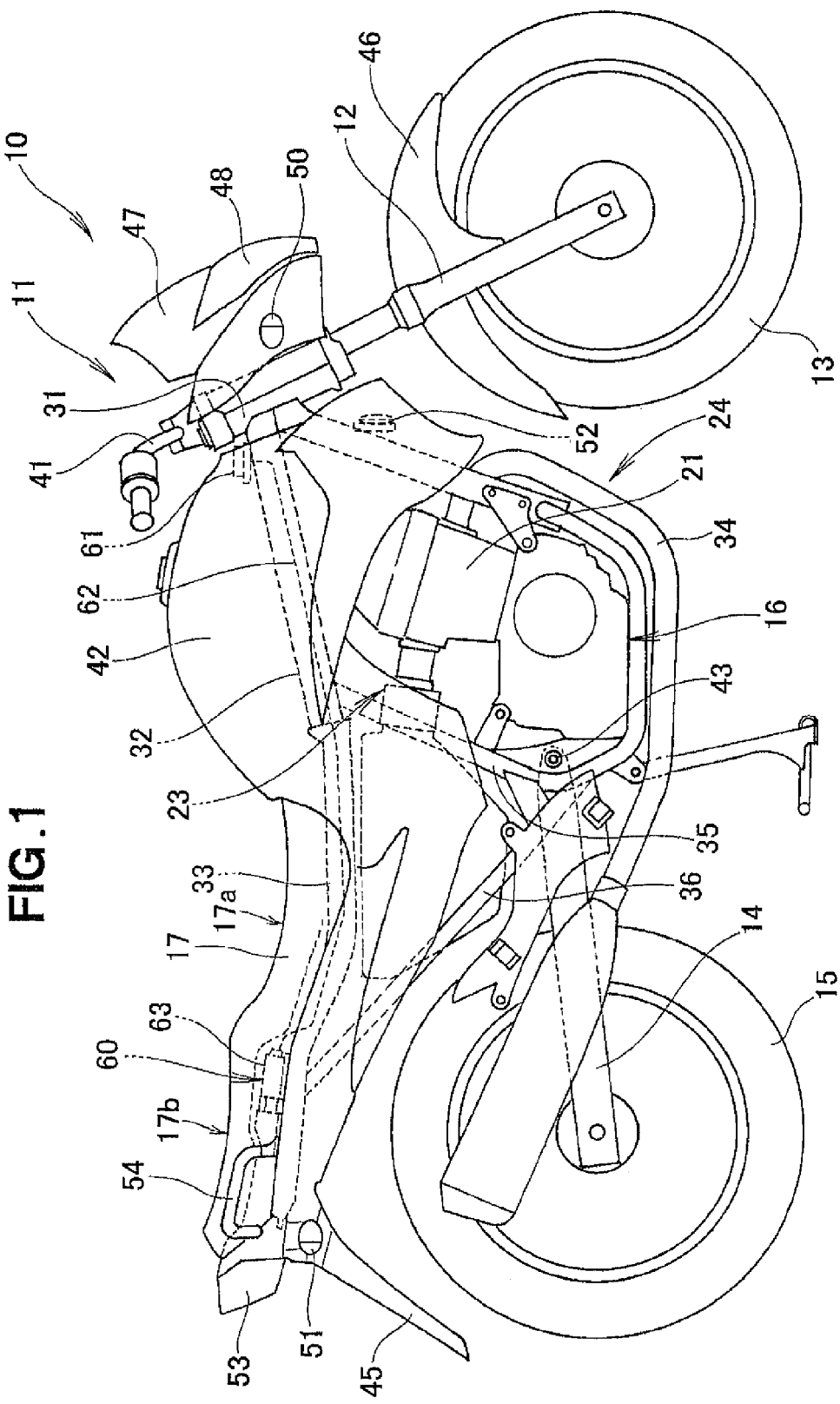
FIG. 1 is a right side view of a motorcycle incorporating therein a waterproof structure for an electronic device according to the present invention.

As shown in FIG. 1, a two-wheeled motor vehicle or motorcycle 10 includes a vehicle body frame 11, a front fork 12 provided at a front part of the vehicle body frame 11, a front wheel 13 mounted on the front folk 12 at a lower end thereof, a swing arm 14 extending rearward from the vehicle body frame 11, and a rear wheel 15 mounted on the swing arm 14 at a rear end thereof.

An engine 16 is disposed between the front wheel 13 and the rear wheel 15. The engine 16 is suspended to the vehicle body frame 11. An intake system 23 for supplying air-fuel mixture and an exhaust system 24 for discharging exhaust gas are connected to a cylinder unit 21 of the engine 16. A seat 17 on which a vehicle driver sits astride is mounted to the vehicle body frame 11 between the front wheel 13 and the rear wheel 15. The seat 17 is composed of a rider seat 17a on a front side for the vehicle driver, and a tandem seat 17b on a rear side.

The vehicle body frame 11 includes a head pipe 31, a main frame 32 extending rearward from the head pipe 31, a seat rail 33 extending rearward from the main frame 32, a lower frame 34 extending obliquely rearward and downward from the head pipe 31 and then extending rearward, a central frame 35 extending from the main frame 32 and connected a rear end of the lower frame 34, and a rear frame 36 extending obliquely rearward and upward from the central frame 35 and connected to a rear part of the seat rail 33.

The front folk 12 is steerably supported by the head pipe 31. A handlebar 41 is mounted on the front folk 12 at an upper end thereof, and the front wheel 13 is mounted on the front folk 12 at the lower end thereof. A fuel tank 42 is disposed above the engine 16 and between the handlebar 41 and the seat 17. The fuel tank 42 is supported by the main frame 32.

At a lower part of the central frame 35, a pivot shaft 43 is provided to extend in a vehicle width direction. The swing arm 14 extends from the pivot shaft 43 in a rearward direction of the vehicle, and the rear wheel 15 is mounted on the rear end of the swing arm 14.

A front fender 46 for blocking mud splashed by the front wheel 13 is mounted on a lower part of the front folk 12, and a front cowl 47 is mounted on an upper part of the front folk 12. The front cowl 47 is provided with a headlight 48 on a front surface thereof, and front blinkers 50 on lateral sides thereof.

A horn 52 is attached to the lower frame 34. A rear fender 45 for blocking mud splashed by the rear wheel 15 is mounted on the seat rail 33. The rear fender 45 is provided with a stop lamp 53 directed rearward, and rear blinkers 51 on lateral sides thereof.

A waterproof structure 60 for an electronic device is disposed on the vehicle body frame 11. The electronic device is configured to detect abnormality of the vehicle and notify it to the outside when the vehicle is subjected to a theft action.

The electronic-device waterproof structure 60 is comprised of a receiving antenna 61 (hereinafter referred to as "GPS antenna 61") disposed on a front part of the main frame 32 for receiving position information from artificial satellites or the like, a wire 62 extending from the GPS antenna 61, and an antitheft device 63 disposed on a rear part of the seat rail 33 for providing a measure for prevention of theft based on the position information acquired via the wire 62.

Next, will be described an arrangement of the antitheft device.

Figure 2:
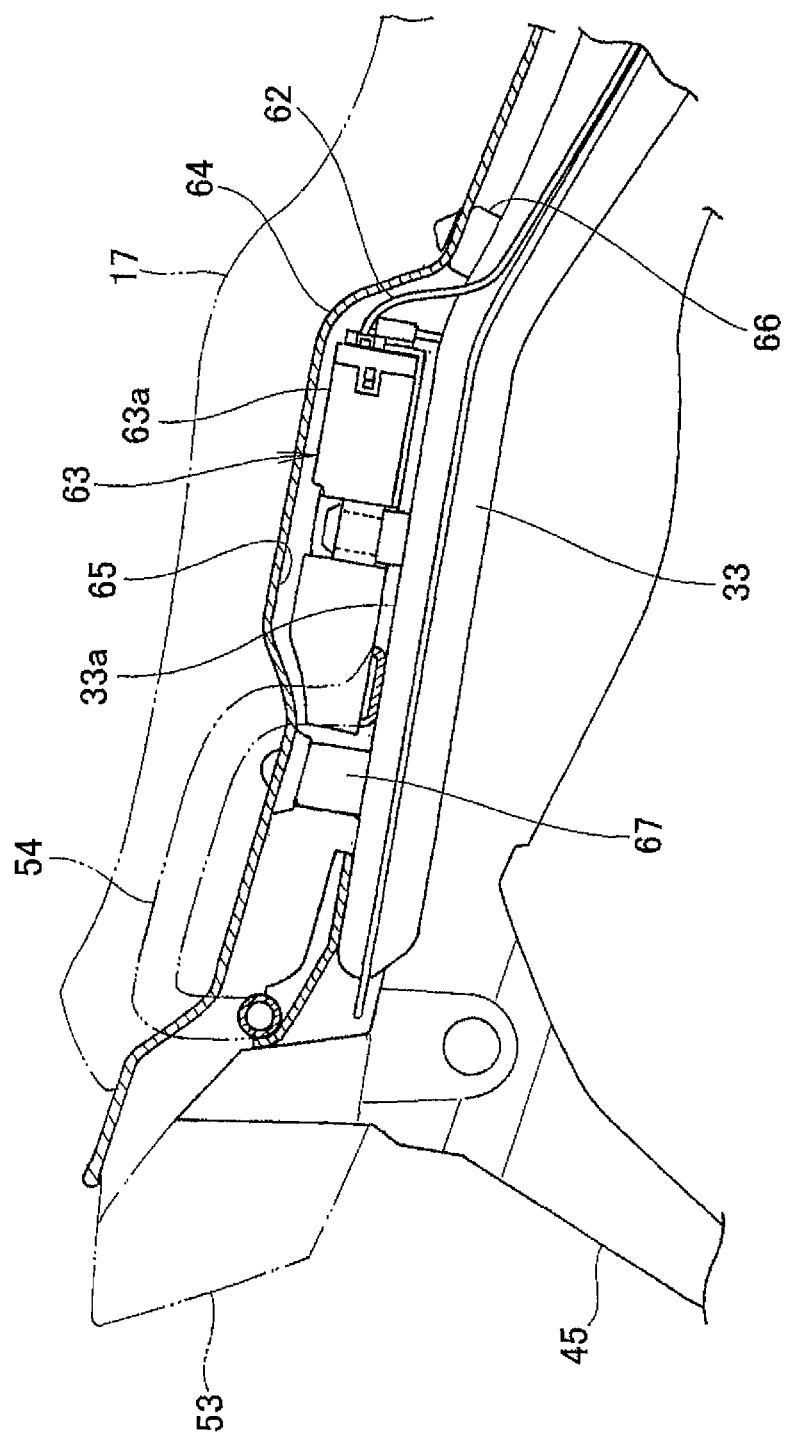
FIG. 2 is a side view of a main part of the motorcycle shown in FIG. 1.

As shown in FIG. 2, the antitheft device 63 is mounted on an upper surface 33a of the seat rail 33, and the seat 17 is disposed above the antitheft device 63. The seat 17 has a bottom plate 64 forming a bottom of the seat 17. The bottom plate 64 has a recessed portion 65 upwardly concaved to avoid interference with the antitheft device 63. A columnar front bushing 66 and a columnar rear bushing 67 extend downwardly from the bottom plate 64 at respective positions located forwardly and rearwardly of the antitheft device 63. With the recessed portion 65 and the front and rear bushings 66, 67 thus provided, the bottom plate 64 is able to protect the antitheft device 63 without interference with the antitheft device 63.

The antitheft device 63 is mounted in such a posture where an upper surface 63a of the antitheft device 63a is substantially horizontal. The wire 62 from the GPS antenna is arranged along the seat rail 33 and connected to the antitheft device 63.

A grab rail 54 which can be gripped by a passenger is attached to the seat rail 33 at a rear of the antitheft device 63.

Next will be described a support structure of the antitheft device.

Figure 3:
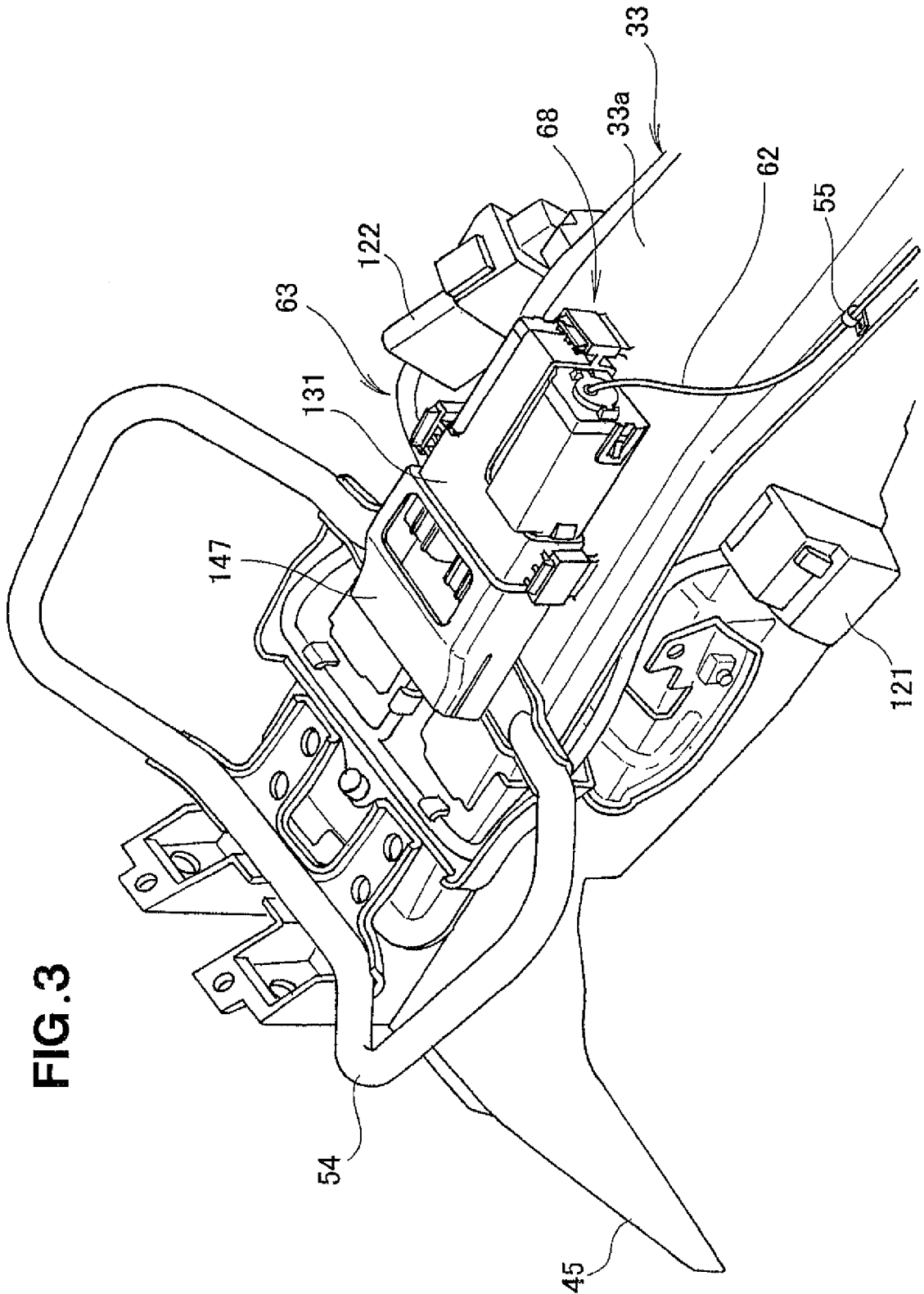
FIG. 3 is a perspective view of an antitheft device and a peripheral part thereof.

As shown in FIG. 3, the antitheft device 63 is mounted the upper surface 33a of the seat rail 33 substantially at a center in the vehicle width direction. The antitheft device 63 is supported by a support stay 68 welded to the upper surface 33a of the seat rail 33. Structural details of the support stay 68 will be described later.

The wire 62 is secured to the seat rail 33 by means of clip 55.

Next will be explained a block diagram of the antitheft device and a peripheral part thereof.

Figure 4:
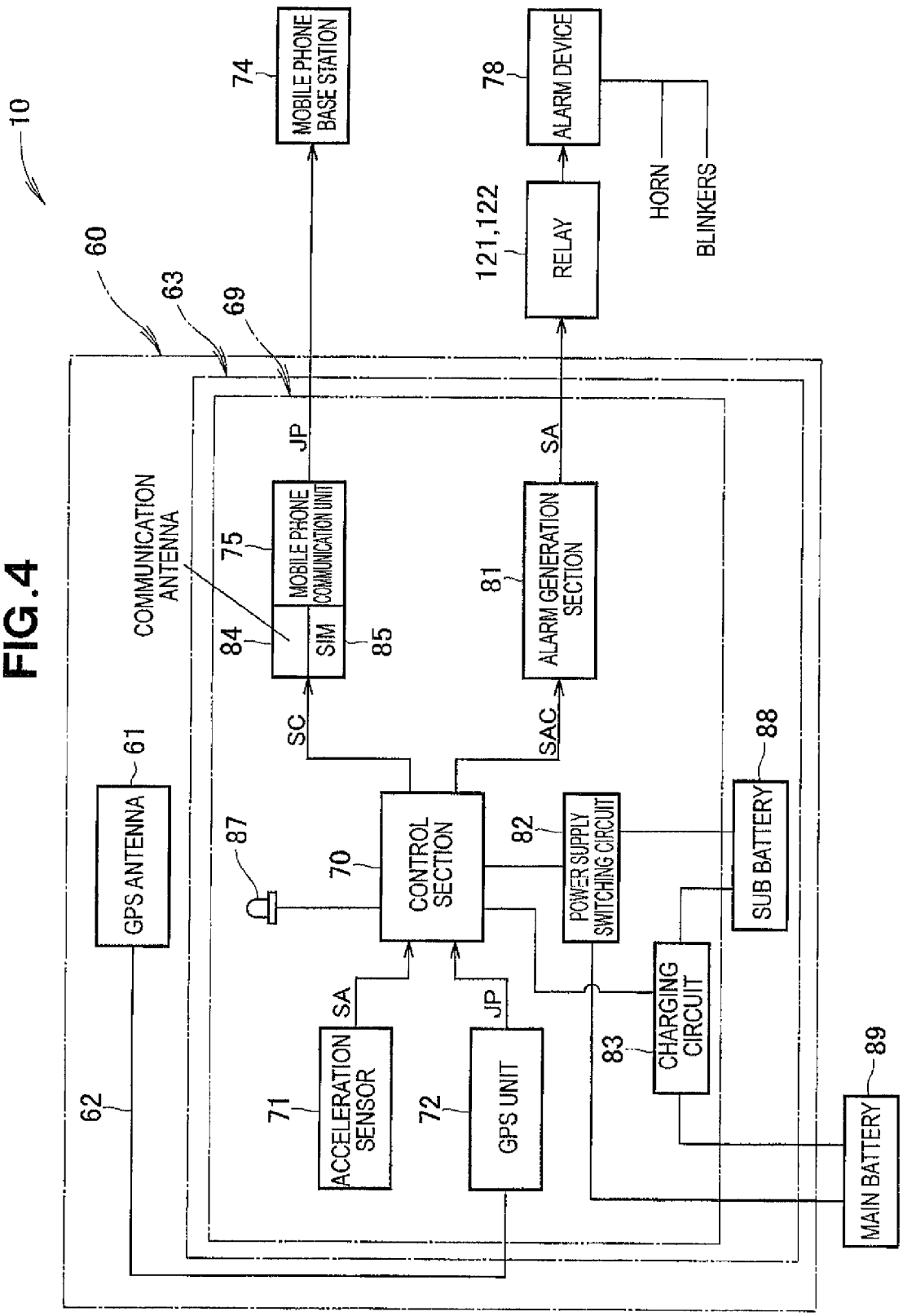
FIG. 4 is a block diagram showing the antitheft device and the peripheral part thereof.

As shown in FIG. 4, the electronic-device waterproof structure 60 includes the GPS antenna 61 and the antitheft device 63 that are separated from each other. The wire 62 extending from the GPS antenna 61 is connected to the antitheft device 63, and the antitheft device 63 includes a processing unit 69 having many electronic components mounted therein. The processing unit 69 essentially includes an acceleration sensor 71 for detecting vibrations applied to a vehicle body of the straddle type two-wheeled motor vehicle (motorcycle) 10, a GPS (Global Positioning System) unit 72 for determining a current position of the vehicle by receiving orbit information from plural satellites, the GPS antenna 61 attached to the GPS unit 72 to receive signals from the satellites, a control section 70 which is configured to receive acceleration signals SA from the acceleration sensor 71 and position information JP from the GPS unit 72 and output a command to perform theft countermeasures, a mobile phone communication unit 75 for sending the position information JP to a mobile phone base station 74 in accordance with a communication command signal SC from the control section 70, an alarm generation section 81 for sending an alarm signal SA to activate alarm devices 78 (lamps such as the headlight 48 and the blinkers 50, 51, and the horn 52 shown in FIG. 1) in accordance with an alarm control signal SAC from the control section 70, a power supply switching circuit 82 for switching power supplies, and a charging circuit 83 for supplying power to a sub battery 88 described later. The antitheft device 63 includes the sub battery 88 provided separately from the processing unit 69. The sub battery 88 is connected to the control section 70. A main battery 89 is mounted on the vehicle.

A light emitting diode 87 is connected to the control section 70 for indicating operating state of the electronic-device waterproof structure 60. The light emitting diode 87 is mounted on the processing unit 69.

With the power supply switching circuit 82 to which the main battery 89 and the sub battery 88 are connected, the power supply for the control section 70 can be switched between these power supplies. The sub battery 88 supplies power to the processing unit 69 when the main battery 89 mounted on the vehicle does not supply power to the substrate 67. As the sub battery 88, for example, a nickel hydrogen battery or a lithium battery is used.

The mobile phone communication unit 75 includes a communication antenna 84 for sending signals to the mobile phone base station 74, and a SIM (Subscriber Identity Module) tip 93 in which a unique ID number for specifying a telephone number is stored. The processing unit 69 may include an engine control section 77 which, on the basis of an engine control signal SEC from the control section 70, sends an ignition-stop signal SSS to an ignition device 76 of the engine 16 (FIG. 1) to stop operation of the ignition device 76 and, hence, the engine 16.

Next will be explained a circuit diagram of the antitheft device and the peripheral part thereof.

Figure 5:
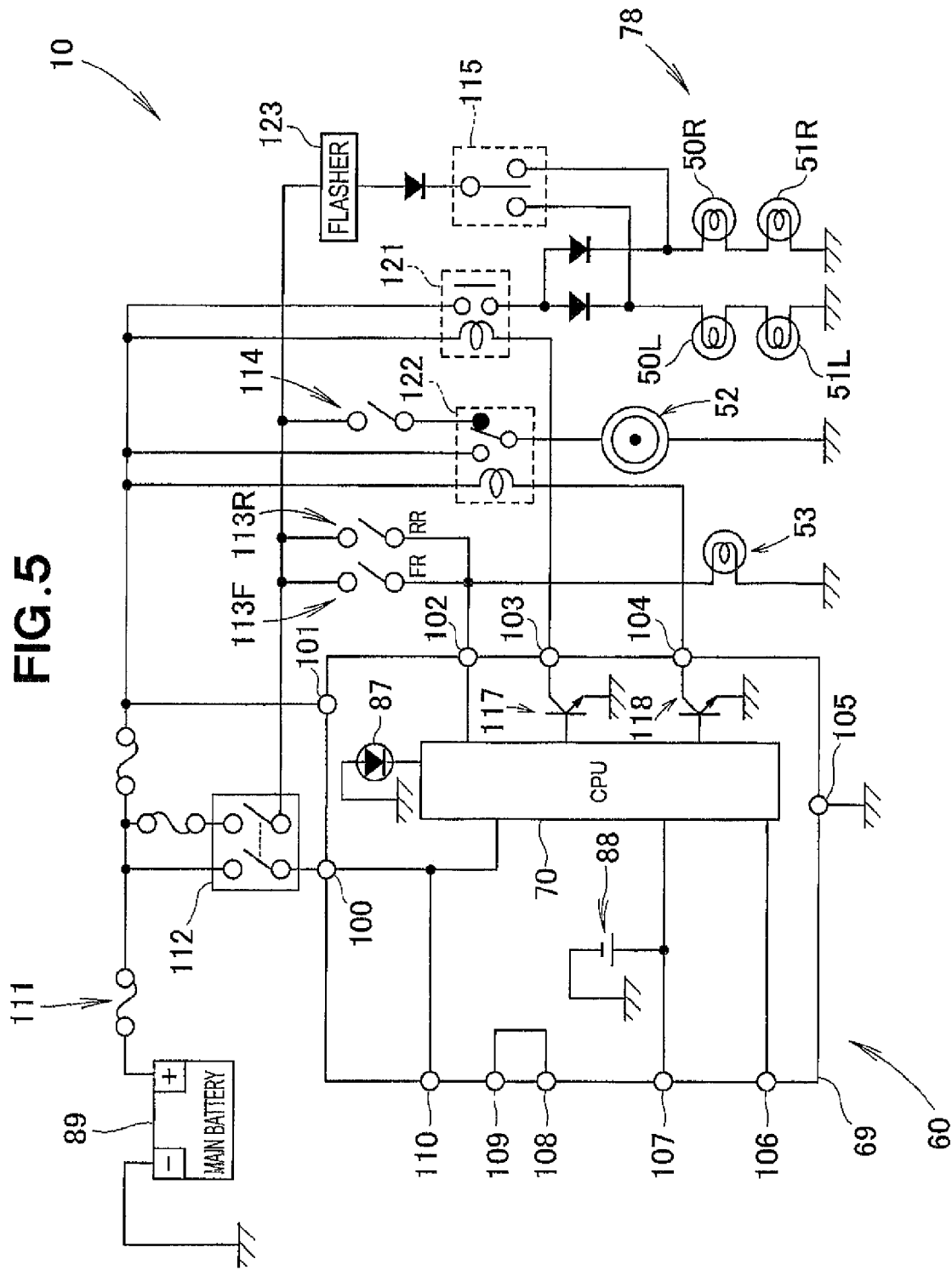
FIG. 5 is a circuit diagram of the antitheft device and the peripheral part thereof.

As shown in FIG. 5, the processing unit 69 is provided with a plurality of terminals 100 to 110. The main battery 89 is connected to the terminal 100 via a main fuse 111, and power from the main battery 89 is thereby supplied to the terminal 100. The terminals 101, 102 are used for monitoring operation states of an ignition switch 112 which connects and disconnects the main power supply and stop switches 113F and 113R which cause the stop lamp 53 to be lighted.

In the two-wheeled motor vehicle 10 as the vehicle, the horn 52 is activated when a horn switch 114 is operated, and the front blinkers 50 (50L, 50R) and the rear blinkers 51 (51L, 51R) are flashed when a blinker switch 115 provided on the handlebar 41 (FIG. 1) is operated. A flasher 123 for flashing the blinkers 50L, 50R, 51L, 51R is connected to the blinker switch 115.

In an ON state of the ignition switch 112, the horn 52 rings when the horn switch 114 is turned on. The front blinker 50L and the rear blinker 51L are flashed when the blinker switch 115 is turned to "left", and the front blinker 50R and the rear blinker 51R are flashed when the blinker switch 115 is turned to "right". Further, the stop lamp 53 is lighted when a front wheel brake is applied and the stop switch 113F is turned on. Also, the stop lamp 53 is lighted when a rear wheel brake is applied and the stop switch 113R is turned on.

In an OFF state of the ignition switch 112, the horn 52, the blinkers 50L, 50R, 51L, 51R, and the stop lamp 53 are not activated, even when the horn switch 114, the blinker switch 115, and the stop switches 113F, 113R are operated.

When an abnormality is detected while the vehicle is parked, the control section 70 turns on transistors 117, 118 to operate relays 121, 122 via the terminals 103, 104, thereby activating the horn 52, the blinkers 50L, 50R, 51L, 51R, and the stop lamp 53 to function as alarm means. In this manner, the electronic-device waterproof structure 60 is configured to notify to the outside when the vehicle is subjected to a theft action.

Other than the above, the terminal 105 is an earth terminal, and the terminals 106 to 110 are used for diagnosis of the processing unit 69, though a description thereof is omitted.

Next will be described a configuration of a case body in which the processing unit of the antitheft device is incorporated.

Figure 6:
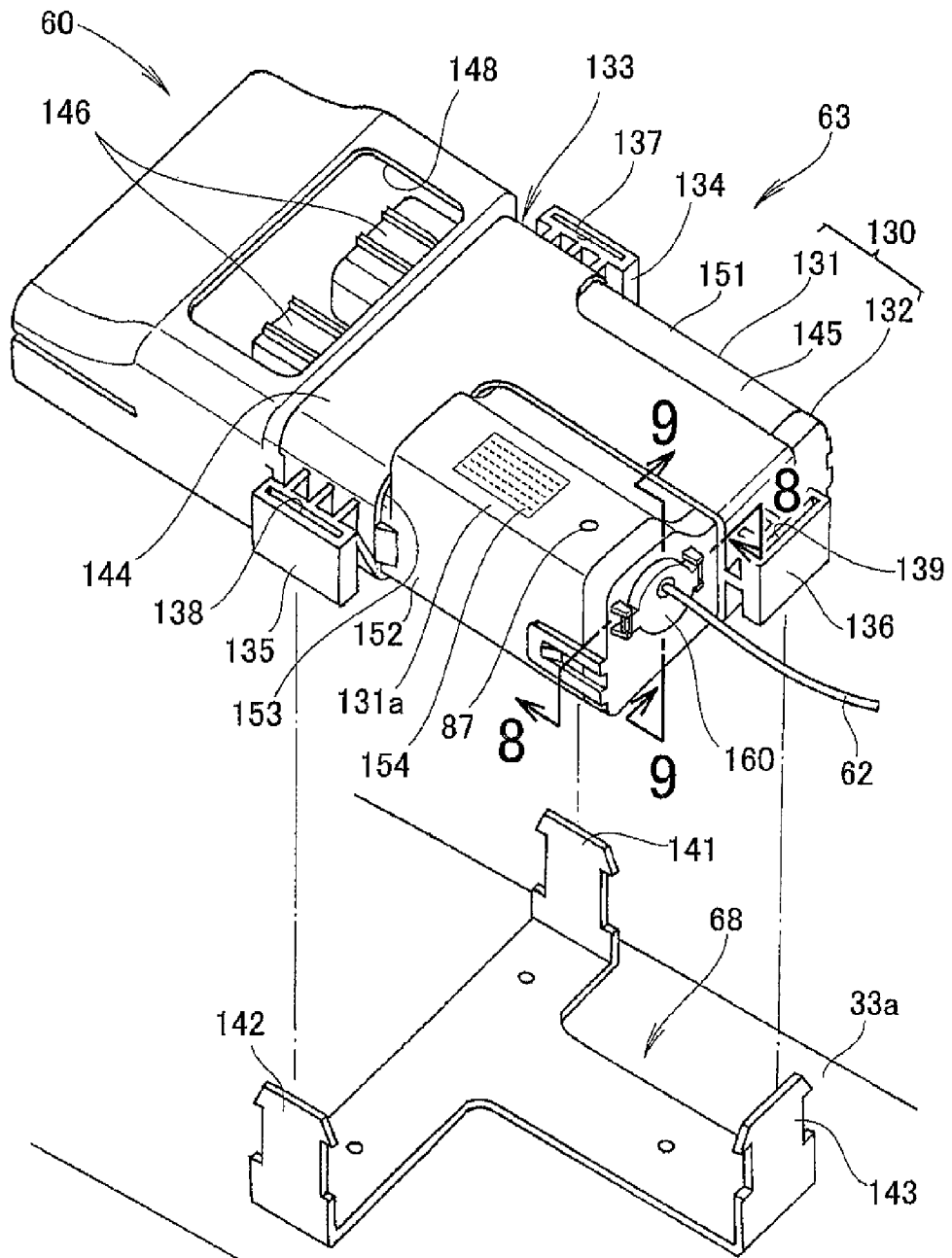
FIG. 6 is an exploded perspective view showing a mounting structure for the antitheft device.

As shown in FIG. 6, the electronic-device waterproof structure 60 is comprised of the GPS antenna 60 (FIG. 1), the wire 62, and the antitheft device 63. The antitheft device 63 includes a case 130 for accommodating therein the processing unit 69 (FIG. 4), and a cap 160 attached to the case 130 with the wire 62 passing therethrough. The case 130 is composed of a box-like case body 131 covering the outside of the processing unit 69, and a lid 132 for closing an opening (detailed later) of the case body 130. The cap 160 is mounted on the lid 132 of the case 130.

The case body 131 is surrounded or wrapped by an elastic bracket 133 extending in longitudinal and transversal directions. The elastic bracket 133 is attached to the support stay 68 welded to the upper surface 33a of the seat rail 33.

The elastic bracket 133 has first to third protrusions 134-136 formed on its outer surface thereof. The protrusions 134-136 have respective engagement holes 137-139 extending in a vertical direction through the protrusions 134-136.

The support stay 68 has a T shape in a plan view and includes first, second and third projections 141, 142, 143 that are formed by bending a central portion of the T-shaped support stay 68 in an upward direction. Each of the projections 141-143 is engageable with a corresponding one of the engagement holes 137-139 of the elastic bracket 133.

With the case body 131 being wrapped by the elastic bracket 133, the engagement holes 137-139 of the elastic bracket 133 is fitted around the corresponding projections 141-143 of the support stay 68, so that the antitheft device 63 is mounted on the support stay 68.

Next will be described a structure of the elastic bracket to which the antitheft device is mounted.

Figure 7:
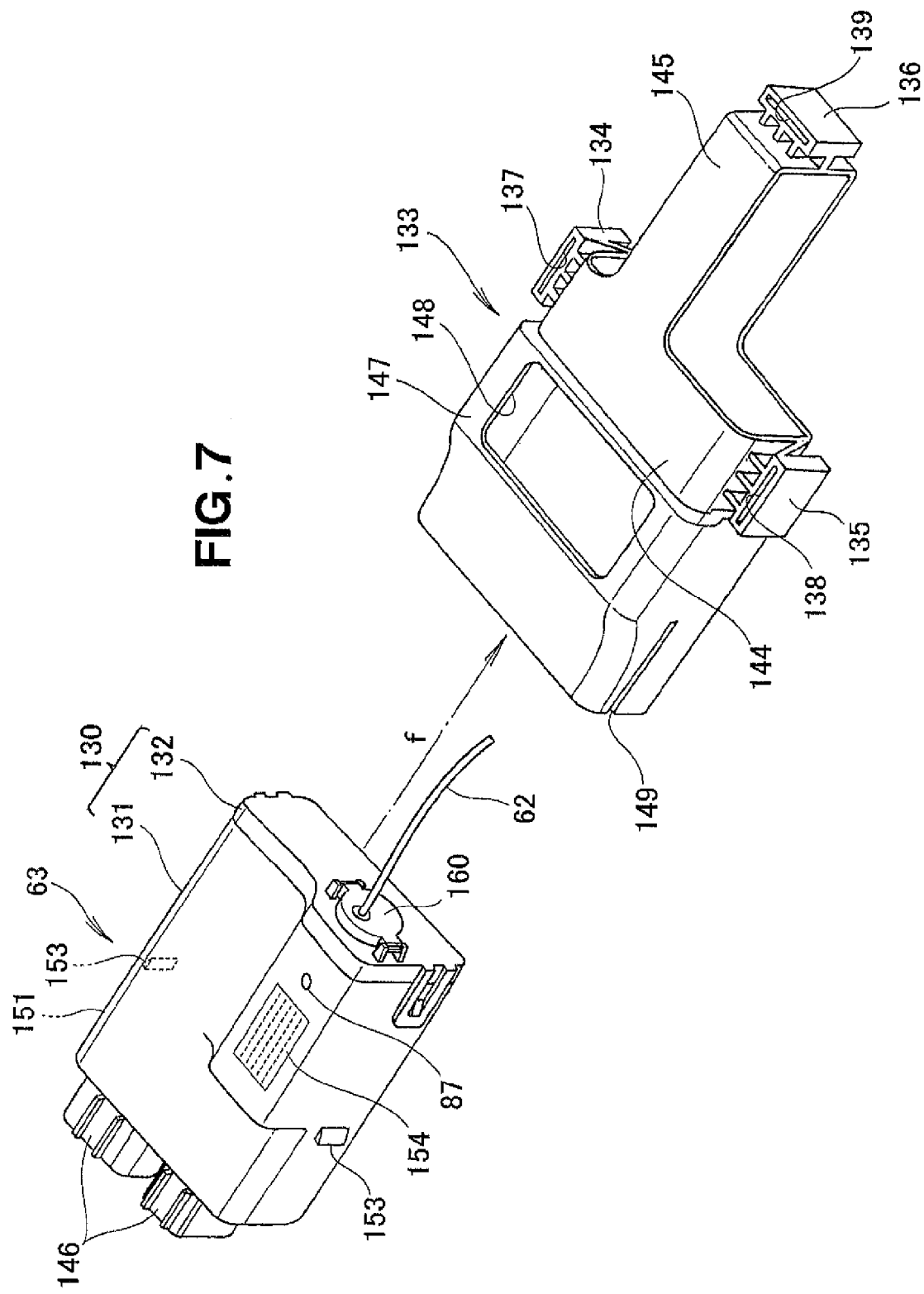
FIG. 7 is an exploded perspective view showing assembly of the antitheft device with an elastic part.

As shown in FIG. 7, the elastic bracket 133 includes a first support portion 144 so surrounding the case body 131 as to wrap the same in the vehicle width direction, a second support portion 145 so surrounding the case body 131 and the lid 132 as to wrap them in the longitudinal direction of the vehicle, the first and second protrusions 134, 135 provided on lateral left and right side surfaces of the first support portion 144, the third protrusion 136 provided on a longitudinally front surface of the second support portion 145, and a terminal guard portion 147 extending from the first support portion 144 in a rearward direction of the vehicle and surrounding terminals 146. The terminal guard portion 147 has an opening 148 formed in a top wall thereof for allowing the terminals 146 to be partly observed when the case body 131 is inserted in the elastic bracket 133. The terminal guard portion 147 has an entrance hole 149 at a rear end thereof for allowing insertion and removal of the antitheft device 63 into the elastic bracket 133. The antitheft device 63 is inserted from the entrance hole 149 into the elastic bracket 133 as indicated by the arrow f so that the case body 131 and the lid 132 is surrounded or wrapped by the elastic bracket 133.

The case body 131 has two stopper prongs 153 projecting outwardly from left and right sidewalls 151 and 152. The stopper prongs 153 are engaged with edges 144a, 144a of the first support portion 144.

As shown in FIG. 6, by a stop action of the stopper prongs 153, the antitheft device 63 is held in position against removal from the elastic bracket 133.

The case body 131 is supported on the vehicle via the elastic bracket 133. The case body 131 bears on its upper surface 181a a recognition number 154 of the electronic-device waterproof structure 60. In order to enable visual recognition of the recognition number 154 in a state where the case body 131 is accommodated in the elastic bracket 133, the elastic bracket 133 has a cutout portion 155 formed between the belt-like first support portion 144 and the belt-like second support portion 145 perpendicular to the first support portion 144.

Next will be described a mount structure of the cap with reference to FIGS. 8 and 9.

Figure 8:
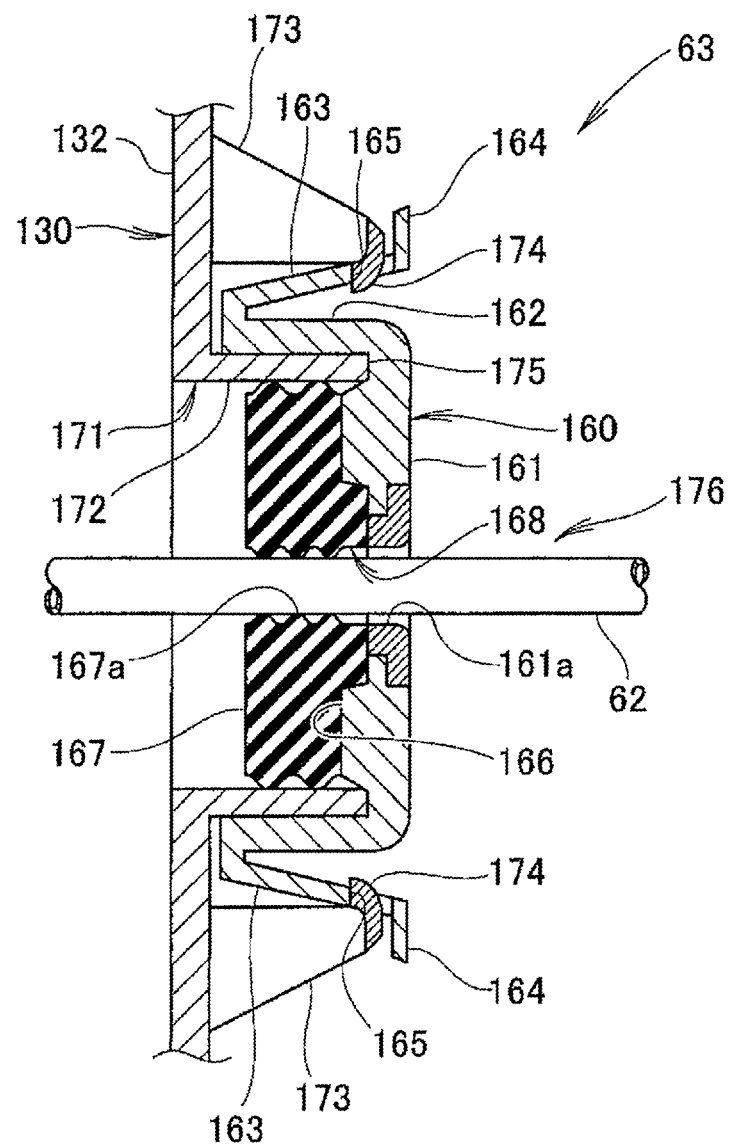
FIG. 8 is a cross-sectional view taken along line 8-8 of FIG. 6.

As shown in FIG. 8, the lid 132 has a cylindrical part 172 extending in the axial direction of the wire 62 in such a manner as to surround a wiring hole 171 through which the wire 62 passes, two diametrically opposed columnar portions 173 disposed on an outer side of the cylindrical part 172 and extending in the axial direction of the wire 62, and locking prongs 174 provided on front ends of the respective columnar portions 173 for locking the cap 160.

The cap 160 includes a cap body 161 for closing an end face 175 of the cylindrical part 172, an outer cylindrical portion 162 extending from the cap body 161 toward the lid 132 in such a manner as to surround the cylindrical part 172, lock portions 163 elastically deformable toward the wire 62 and bent back from a distal end of the outer cylindrical portion 162 and extending in such a manner as to separate from the lid 132 past an exterior side of the cylindrical portion 162, and hook parts 164 formed integrally with distal ends of the respective locking portions 163 for engagement with a tool or fingers when the locking portions 163 are to be deflected toward the wire 62. The locking portions 163 have locking holes 165 for allowing passage therethrough of the locking prongs 174.

The cap 160 has a rear surface 166 on which a seal member 167 is disposed. The seal member 167 is housed in a compressed state in the cap 160 and surrounds the wire 62. The cap 160 has a hole 168 formed substantially at the center in the lateral direction thereof for the passage therethrough of the wire 42. The seal member 167 includes an elastic supporting portion 167a provided on an inner circumferential surface of the hole for elastically supporting the wire 62, and an outer elastic supporting portion 169 provided on an outer circumferential surface of the seal member 167. The cap body 161 is provided with a regulating member 161a for regulating movement of the wire in a direction perpendicular to the axis of the wire 62.

Figure 9:
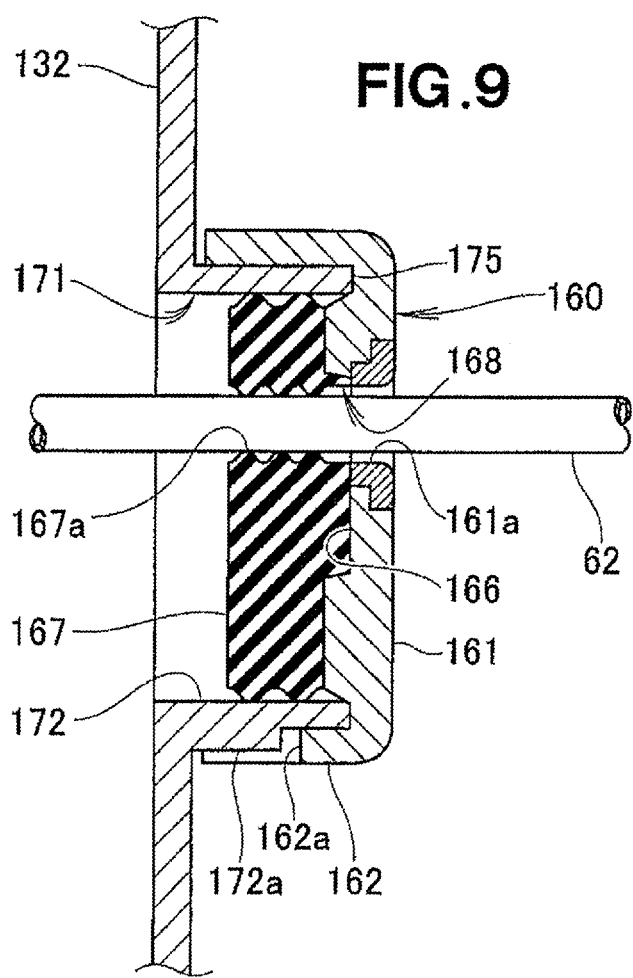
FIG. 9 is a cross-sectional view taken along line 9-9 of FIG. 6.

As shown in FIG. 9, the hole 168 of the cap 160, through which the wire 62 passes, is offset from the center of the cap 160 to an upper side thereof. The outer cylindrical portion 162 extends from the cap body 161 toward the lid 132 along the cylindrical part 172. The outer cylindrical portion 162 has a cutout recess 162a formed at a lower part thereof.

The cylindrical part 172 has a projection 172a formed on a lower part of an outer circumferential surface of the cylindrical part 172. The projection 172a is engaged with the cutout recess 162a of the cap 160. An attempt to fit the cap 160 upside down will end unsuccessful because the projection 172a interferes with an end edge of the cap 160. The cap 160 is always fitted on the lid 132 in correct orientation.

Next will be described a structure of the antitheft device.

Figure 10:
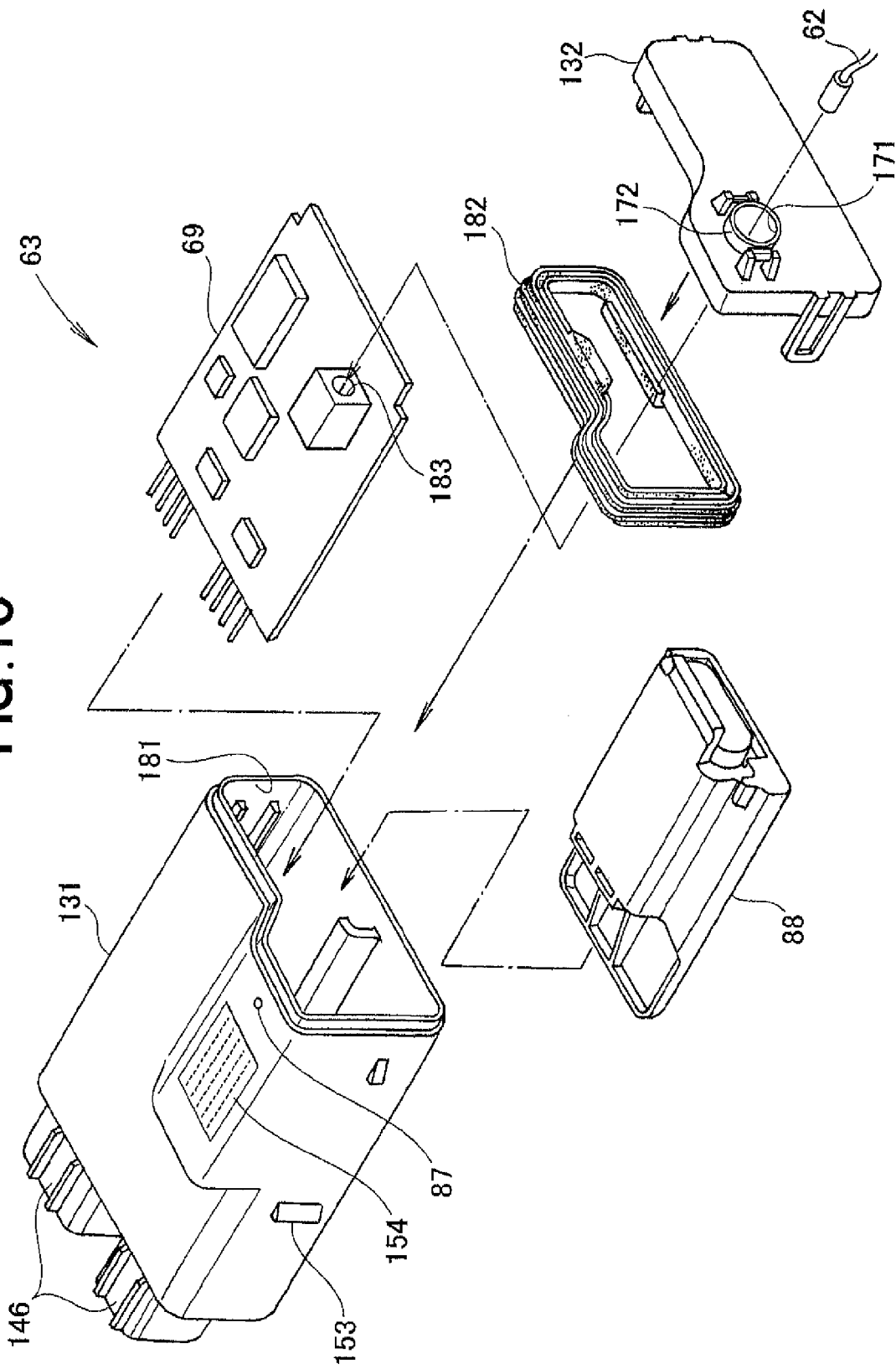
FIG. 10 is an exploded perspective view showing structural elements and wiring of the antitheft device.

As shown in FIG. 10, the antitheft device 63 is composed of the case body 131, the processing unit (substrate) 69 built in the case body 131, the sub battery 88 housed in the case body 131 at a position below the processing unit 69, the lid 131 for closing an opening 181 of the case body 131, and a seal member 182 provided between the lid 132 and the case body 131 and sealing between the lid 132 and the opening 181 of the case body 131.

The antitheft device 63 is such a device, which is mounted on the vehicle 10 (FIG. 1) and configured to detect abnormality of the vehicle 10 occurring due to a theft action and notify it to the outside.

The processing unit 69 is removably inserted in the case body 131 via the opening 181. Similarly, the sub battery 88 is removably inserted in the case body 131 via the opening 181. The seal member 182 and the lid 132 are detachably attached to the opening 181 of the case body 131. The wire 62 has one end inserted through the wiring hole 171 of the lid 132 into a joint portion 183 of the processing unit 69.

Description will be made of a structure of the lid.

Figure 11:
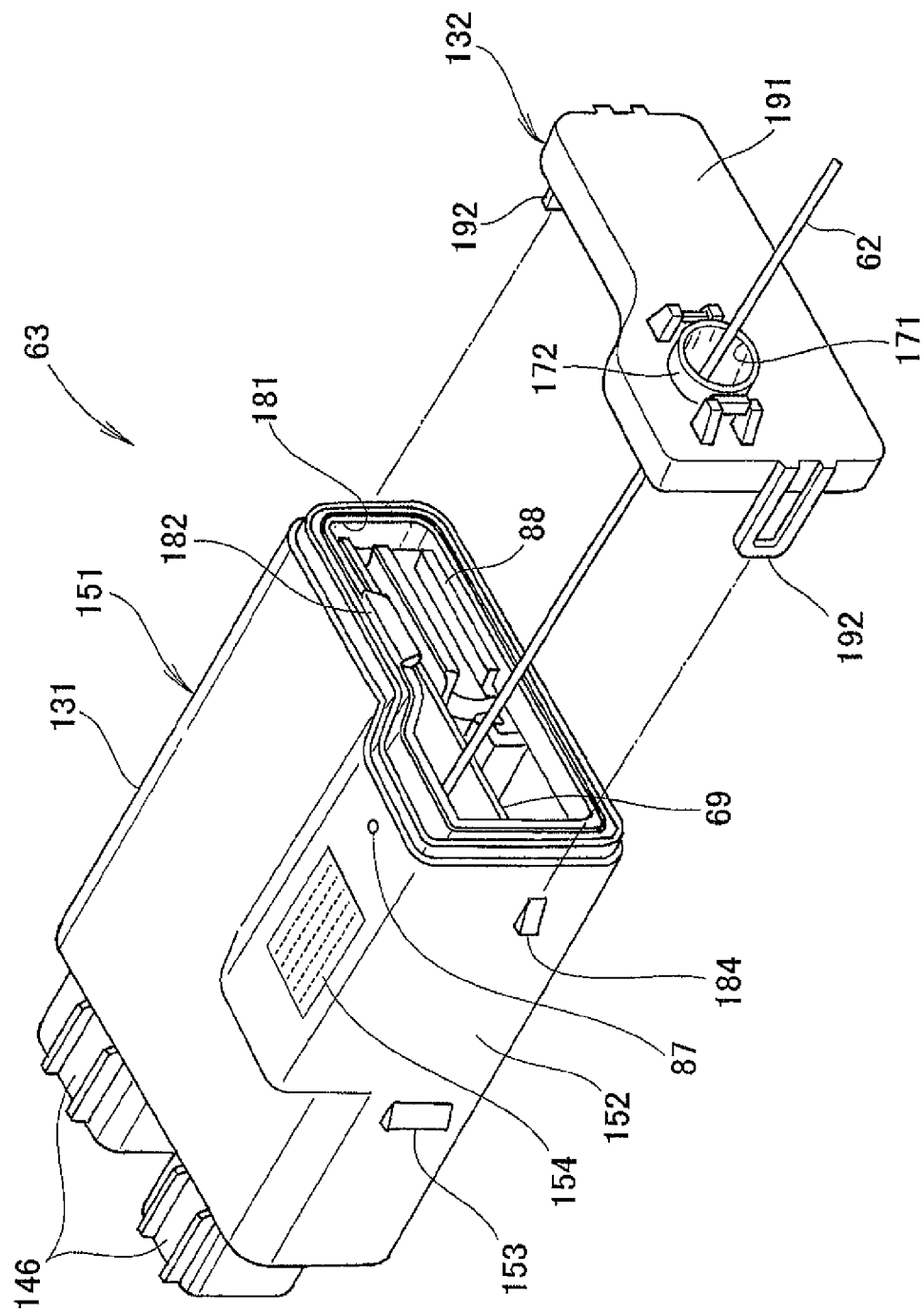
FIG. 11 is an exploded perspective view illustrative of the manner in which a lid is attached to a case body.

As shown in FIG. 11, the case body 131 has two lid stopper prongs 184 (only one being shown) projecting from outer surfaces 151, 152 of left and right sidewalls of the case body 131. The lid 132 includes a lid body 191 and two retainer portions 192, 192 extending from left and right ends of the lid body 191 toward the case body 131 for locking engagement with the lid stopper prongs 184. By virtue of the interlocking engagement between the lid stopper prongs 184 and the retainer portions 192, the lid 132 is detachably mounted on the case body 131. The wire 62 extends to the outside of the lid 132 via the wiring hole 171.

Next will be described a manner in which the cap is mounted.

Figure 12:
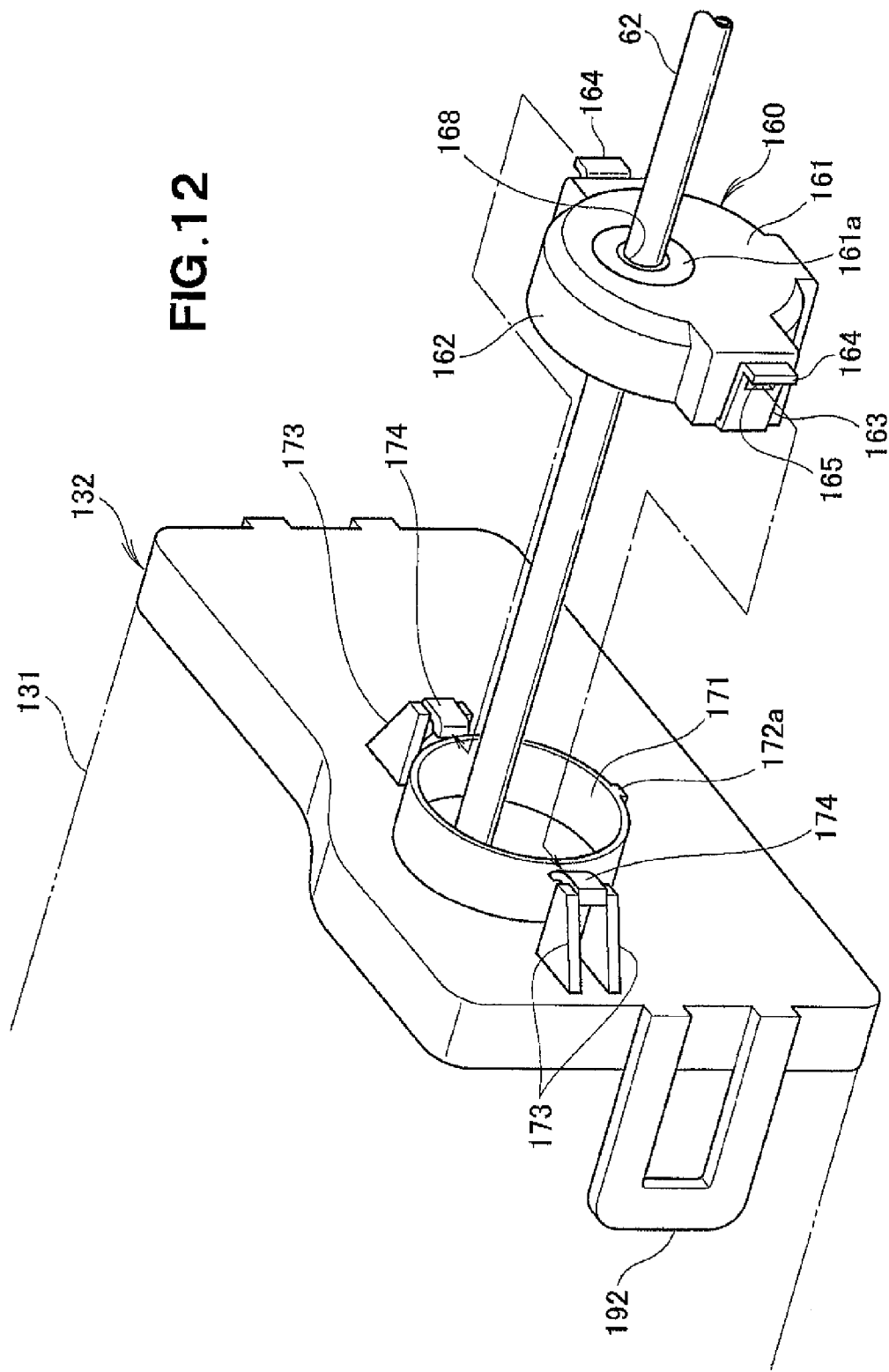
FIG. 12 is an exploded perspective view illustrative of the manner in which a cap is attached to the lid.

As shown in FIG. 12, with the wire 62 passing through the hole 168, the cap 160 is forced toward the lid 132 until the locking prongs 174 move into interlocking engagement with the locking holes 165 of the respective locking portions 163. In this instance, the locking portions 163 of the cap 160 are first brought into abutment with the locking prongs 174 of the lid 132, then deflect in a radial inward direction of the cap 160. When the cap 160 reaches a fully advanced position, the locking prongs 174 fit in the locking holes 165 whereupon the locking portions 165 are allowed to spring back in a radial outward direction of the cap 160 to thereby lock the cap 160 onto the lid 132.

Next will be described an operation of the antitheft device of the foregoing construction.

FIG. 13(a) is a view showing a condition in which the cap 160 is attached to the lid 132. When the hook parts 164 are depressed as indicated by the arrows (a), the locking portions 163 deflect in a radial inward direction of the cap 160 to the extent that the locking portions 163 are released from interlocking engagement with the locking prongs 174.

FIG. 13(b) is a view showing a condition in which the locking portions 163 are unlocked from the locking prongs 174. With the locking portions 163 thus unlocked from the locking prongs 174, the cap 160 is displaced in a direction indicated by the arrow (b). This will allow the cap 160 to be detached from the lid 132. While the cap 160 is removed from the lid 132, the wire 62 remains stationary.

Advantageous effects attained by the afore-described antitheft device will be enumerated below.

As shown in FIG. 8, the antitheft device 63 includes the seal member 167 housed in a compressed state in the cylindrical part 172 of the case 130 and surrounding the wire 62, and the cap 160 detachably mounted on the case 130, having the hole 171 for the passage therethrough of the wire 62, and keeping the seal member 167 from displacing within the cap 160.

The wire 62 is arranged to pass through the hole 168 of the cap 160. With this arrangement, when the wire 62 is subjected to a force acting in a direction perpendicular to the axis of the wire 62, the cap 160 serves to regulate or limit movement of the wire 62 in the same direction as the acting direction of the force. By thus regulating the movement of the wire 62 in a direction perpendicular to the axis of the wire 62, a deformation of the seal member 167 in a radial direction thereof does not take place and no gap is created between an inner circumference of the seal member 167 and an outer circumference of the wire 62. The wire 62 is surrounded in a compressed state by the seal member 167 and, hence, the seal member 167 can reliably provide a seal between the wire 62 and the seal member 167. Thus, the waterproofing performance of the case at a portion 176 where the wire 62 passes is improved.

As shown in FIG. 10, the case 130 includes the case body 131 accommodating therein the processing unit 69, and the lid 132 detachably mounted to the case body 131 and having the wiring hole 171.

With the lid 132 having the wiring hole 171, removing the lid 132 from the case body 131 will allow a tool or fingers to access a joint portion 183 provided for the wire 62 inside the case body 131. This will make it possible to perform connection of the wire 62 to the joint portion 183 with ease.

As shown in FIG. 8, the cap 160 includes the locking portions 163 elastically deformable toward the wire 62 and bent back from the distal end of an outer cylindrical portion 162 in such a manner as to separate from the case 130 past an exterior side of the cylindrical portion 162, and the hook parts 164 formed integrally with the distal ends of the respective locking portions 163 for engagement with a tool or fingers, and the case 130 has the locking prongs for anchoring the locking portions 163.

When the hook parts 164 are depressed, the locking portions 163 undergo elastic deformation to thereby release the interlocking engagement between the locking portions 163 and the locking prongs 164, allowing the cap 160 to be removed 160.

In FIG. 8, the locking portions 163 have respective locking holes 165 for allowing passage therethrough of the locking prongs 174.

With the locking prongs 174 engaged with the locking holes 165, the locking portions 163 are reliably locked in position.

As shown in FIG. 8, the cap 160 is in engagement with the seal member 167 to regulate movement of the seal member 167 in a removing direction. With this engagement between the cap 160 and the seal member 167, the seal members 167 are firmly secured in position against removal.

In FIG. 1, the processing unit 69 (FIG. 10) incorporated in the antitheft device 63 is disposed below the seat 17, and the receiving antenna 61 is disposed in a front part of the vehicle 10. With the processing unit 69 disposed below the seat 17, effective use of the space is possible. Furthermore, the receiving antenna 61 disposed in the front part of the vehicle 10 does not constitute an obstruction to the vehicle driver.

As shown in FIG. 1, the processing unit 69 (FIG. 10) incorporated in the antitheft device 63 is disposed in a region below the tandem seat 17b, and the receiving antenna 61 is disposed below the fuel tank 42 provided behind the head pipe 31. With the receiving antenna 61 disposed below the fuel tank 42 provided behind the head pipe 31, the receiving antenna 61 is not subjected to a load from the vehicle driver but protected by the fuel tank 42. Furthermore, by thus providing the receiving antenna 61 disposed at a higher position behind the head pipe 31, the receiving performance of the receiving antenna is improved.

In FIG. 3, the processing unit 69 (FIG. 10) incorporated in the antitheft device 63 is disposed in a position overlapped, in a rear view of the vehicle, with the rear grip 54 extending leftwards and rightwards from the seat 17 (FIG. 2) in a vehicle width direction. With this arrangement, because the processing unit 69 is located inwardly of the rear grip 54 in the vehicle width direction, the processing unit 69 is protected on its lateral sides and rendered uneasy to access.

As shown in FIG. 3, the electronic device 63 is a vehicular antitheft device for preventing theft of the vehicle based on location information. The vehicle such as motorcycle 10 becomes wet while running in the rain. The electronic device waterproof structure 60 according to the invention completely prevents entrance of raindrops into the case 10 (FIG. 6) and, hence, is particularly suitable for a waterproof structure for such a vehicular antitheft device 63.

Although in the illustrated embodiment, the present invention is applied to a motorcycle, it is apparent that the invention can be also applied to straddle-type three-wheeled vehicles (three-wheeled buggies) or straddle-type four-wheeled vehicles (four-wheeled buggies) and even has no difficulty in applying to ordinary small vehicles.

INDUSTRIAL APPLICABILITY

With the arrangements so far described, the present invention can be used advantageously as an antitheft device for a motorcycle.

REFERENCE SIGNS LIST

10: vehicle (motorcycle)
60: waterproof structure for an electronic device
61: receiving antenna (GPS antenna)
62: wire
63: electronic device (antitheft device)
69: processing unit (substrate)
130: case
131: case body
132: lid
160: cap
161: cap body
162: outer cylindrical portion
163: locking portion
164: hook part for engagement with a tool
165: locking hole
167: seal member
168: hole in the cap
171: wiring hole
172: cylindrical part
174: locking prong
175: end face of the cylindrical part

The invention claimed is:

1. A waterproof structure for an electronic device that acquires location information, which has been acquired by a receiving antenna provided on a vehicle, from the receiving antenna via a wire, the water proof structure comprising:
   a case disposed in a location in the vehicle distant from the receiving antenna, housing a processing unit that processes the location information, and having a wiring hole through which the wire passes;
   a cylindrical part extending in an axial direction of the wire from the case in such a manner as to surround the wiring hole;
   a seal member housed in the cylindrical part and sealing between the cylindrical member and the wire; and
   a cap detachably mounted to the case, having a hole for the passage therethrough of the wire, covering the seal member, and fitted with the cylindrical part.

2. The waterproof structure for an electronic device as defined in claim 1, the case includes a case body accommodating therein the processing unit, and a lid removably mounted to the case body and having the wiring hole defined therethrough.

3. The waterproof structure for an electronic device as defined in claim 1, wherein the cap includes a cap body for closing an end face of the cylindrical part, an outer cylindrical portion extending from an edge of the cap body toward the case in such a manner as to surround the cylindrical part, and a locking portion formed on the outer cylindrical portion for locking the cap, the locking portion being formed integrally with a distal end of the outer cylindrical portion and having a hook part adapted for engagement with a tool or fingers of a user when the locking portion is to be deflected toward the wire, and wherein the case has a locking prong for anchoring the locking portion.

4. The waterproof structure for an electronic device as defined in claimed 3, wherein the locking portion has a locking hole for allowing passage therethrough of the locking prong.

5. The waterproof structure for an electronic device as defined in claim 4, wherein the cap is in engagement with the seal member to regulate movement of the seal member in a removing direction.

6. The waterproof structure for an electronic device as defined in claim 5, wherein the processing unit is disposed below a seat of the vehicle, and the receiving antenna is disposed in a front part of the vehicle.

7. The waterproof structure for an electronic device as defined in claim 5, wherein the processing unit is disposed in a region below a tandem seat of the vehicle, and the receiving antenna is disposed below a fuel tank provided of the vehicle behind a head pipe of the vehicle.

8. The waterproof structure for an electronic device as defined in claim 7, wherein the processing unit is disposed in a position overlapped, when viewed from a rear of the vehicle, with a rear grip of the vehicle extending leftwards and rightwards from a seat in a vehicle width direction.

9. The waterproof structure for an electronic device as defined in claim 1, wherein the electronic device is a vehicular antitheft device for preventing theft of the vehicle based on the location information.

\* \* \* \* \*